US006985040B2

(12) United States Patent
Kim

(10) Patent No.: US 6,985,040 B2
(45) Date of Patent: Jan. 10, 2006

(54) VOLTAGE CONTROLLED OSCILLATOR AND METHOD OF GENERATING AN OSCILLATING SIGNAL

(75) Inventor: Ji-Hyun Kim, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/829,134

(22) Filed: Apr. 21, 2004

(65) Prior Publication Data

US 2005/0030109 A1 Feb. 10, 2005

(30) Foreign Application Priority Data

Aug. 8, 2003 (KR) ..................... 10-2003-0055085

(51) Int. Cl.
*H03L 7/00* (2006.01)

(52) U.S. Cl. .......................... 331/16; 331/57; 331/176; 331/116 FE

(58) Field of Classification Search .................. 331/16, 331/18, 57, 116 FE, 175, 176, 185
See application file for complete search history.

(56) References Cited

U.S. PATENT DOCUMENTS 5,061,907 A * 10/1991 Rasmussen .................. 331/57
5,331,295 A * 7/1994 Jelinek et al. ................ 331/57
5,600,281 A * 2/1997 Mori et al. .................... 331/57
5,783,936 A * 7/1998 Girard et al. ............... 323/315
6,243,784 B1 * 6/2001 Anderson et al. ........... 713/401
6,404,295 B1 * 6/2002 Minami et al. ............... 331/57
6,809,603 B1 * 10/2004 Ho ............................. 331/57
2004/0012449 A1 * 1/2004 Illegems ...................... 331/57

FOREIGN PATENT DOCUMENTS

JP 2001-244743 9/2001
KR 01-73762 8/2001

* cited by examiner

*Primary Examiner*—Timothy P. Callahan
*Assistant Examiner*—An T. Luu
(74) *Attorney, Agent, or Firm*—Mills & Onello LLP

(57) ABSTRACT

A voltage controlled oscillator (VCO) includes a current source, a current sink and a frequency generator. The current source generates a first current having a first negative temperature coefficient. The current sink generates a second current. A current level of the second current varies in response to a first voltage level of a control voltage, and the second current has a second negative temperature coefficient. The frequency generator generates an oscillating signal having a frequency corresponding to a difference between the first and second currents. The VCO generates the oscillating signal having a stable frequency that is independent of temperature variation.

10 Claims, 6 Drawing Sheets

VOLTAGE CONTROLLED OSCILLATOR AND METHOD OF GENERATING AN OSCILLATING SIGNAL

CROSS-REFERENCE TO RELATED APPLICATIONS

This application relies for priority upon Korean Patent Application No. 2003-55085 filed on Aug. 8, 2003, the contents of which are herein incorporated by reference in their entirety.

BACKGROUND OF THE INVENTION

1. Field of the Invention

The present invention relates to a voltage controlled oscillator and a method of generating an oscillating signal. More particularly, the present invention relates to a temperature independent voltage controlled oscillator and a method of generating an oscillating signal that may generate an oscillating signal having a stable frequency independent of temperature variation.

2. Description of the Related Art

A voltage controlled oscillator (VCO) generates an oscillating signal having a frequency corresponding to an input voltage, and is used in a phase locked loop (PLL) as to generate oscillating signals.

FIG. 1 is a circuit diagram showing a conventional voltage controlled oscillator.

As shown in FIG. 1, a current mirror 100 of the conventional VCO generates a current 12 corresponding to a control voltage provided from an external source, and a ring oscillator 110 generates an oscillating signal having a frequency corresponding to the current 12. A buffer 120 stabilizes the oscillating signal and outputs a stabilized oscillating signal Fout.

The frequency of the oscillating signal Fout is proportional to the current I2.

Typically, the current I2 decreases as temperature increases. Accordingly, the frequency of the oscillating signal Fout decreases as temperature increases. As a result, a gain [Hz/V] of the VCO decreases as the temperature increases. The gain is referred to as a frequency to control voltage ratio.

Threshold voltages of the transistors M2 and M3 of the current mirror 100 decrease as temperature increases. Thus, the current I2 generated by the current mirror 100 decreases as the temperature increases.

FIG. 2 is a graph showing frequency variations of the voltage controlled oscillator of FIG. 1 according to temperature variation when the control voltage Vctrl is changed from 0 to 1.8 volts. Curve 'A' of FIG. 2 shows frequency variation when the temperature is −55° C.; curve 'B' of FIG. 2 shows frequency variation when the temperature is 55° C.; and curve 'C' of FIG. 2 shows frequency variation when the temperature is 125° C.

Referring to FIG. 2, the frequency of the oscillating signal Fout decreases as temperature increases, and thus the gain (slope of the curve in FIG. 2) of the VCO decreases as the temperature increases.

Therefore, the frequency of the oscillating signal generated from the conventional VCO may vary depending upon temperature variation.

As a result, the conventional VCO may not generate a signal at the desired frequency when the conventional VCO operates in semiconductor chip of a high speed digital system that generates a lot of heat.

SUMMARY OF THE INVENTION

Accordingly, the present invention is provided to substantially obviate one or more problems due to limitations and disadvantages of the related art.

It is a first feature of the present invention to provide a voltage controlled oscillator that is configured to generate an oscillating signal having a stable frequency independent of temperature variation.

It is a second feature of the present invention to provide a method of generating the oscillating signal having a stable frequency independent of temperature variation.

In one aspect, the invention is directed to a voltage controlled oscillator (VCO). The VCO of the invention includes: a current source that is configured to generate a first current having a first negative temperature coefficient; a current sink that is configured to generate a second current, a current level of the second current varying in response to a first voltage level of a control voltage, the second current having a second negative temperature coefficient; and a frequency generator that is configured to generate an oscillating signal having a frequency corresponding to a difference between the first and second currents.

In one embodiment, the current source includes: a reference current source that is configured to generate a reference current; a voltage generator that is configured to receive the reference current to generate a bias voltage based on the reference current; and a current mirror circuit that is configured to generate the first current, the first current being substantially a same current as the reference current. The voltage generator can includes: a first transistor, a second current electrode of the first transistor receiving the reference current, the second current electrode of the first transistor being connected to a control electrode of the first transistor; and a second transistor, a control electrode of the second transistor being connected to the control electrode of the first transistor. The current mirror circuit can include: a third transistor, a second current electrode of the third transistor being connected to the second current electrode of the second transistor, the second current electrode of the third transistor being connected to a control electrode of the third transistor; and a fourth transistor, a control electrode of the fourth transistor being connected to the control electrode of the third transistor.

In one embodiment, the current sink includes: a voltage level shifter that is configured to convert the first voltage level of the control voltage into a second voltage level to generate a first voltage having the second voltage level, and is configured to generate the second current corresponding to the first voltage; and a current subtractor that is configured to subtract the second current from the first current. The voltage level shifter can include: a first level shifter that is configured to convert the first voltage level of the control voltage into the second voltage level to generate the first voltage having the second voltage level; and a second level shifter that is configured to convert the second voltage level of the first voltage into a third voltage level to generate a second voltage having the third voltage level. In one embodiment, the first level shifter includes: a first transistor, a control electrode of the first transistor receiving a bias voltage based on a reference current; a second transistor, a control electrode of the second transistor receiving the control voltage, a first current electrode of the second transistor being connected to a second current electrode of the first transistor. The second level shifter includes a third transistor, a control electrode of the third transistor receiving the first voltage from the first level shifter, a first current electrode of the third transistor being connected to the current subtractor.

In one embodiment, the frequency generator includes: a ring oscillator that is configured to generate a first oscillating signal having the frequency corresponding to the difference between the first and second currents; and a buffer that is configured to convert a swing width of the first oscillating signal into a full swing width to generate the oscillating signal.

In another aspect, the invention is directed to a voltage controlled oscillator that includes: a voltage generator that is configured to generate a bias voltage based on a reference current; a current mirror circuit that is configured to generate a first current, the first current being substantially the same current as the reference current and having a first negative temperature coefficient; a first level shifter that is configured to convert a first voltage level of the control voltage into a second voltage level in response to the bias voltage to generate a first voltage having the second voltage level; a second level shifter that is configured to convert the second voltage level of the first voltage into a third voltage level to generate a second voltage having the third voltage level, and configured to generate a second current corresponding to the second voltage and having a second negative temperature coefficient; a current subtractor that is configured to subtract the second current from the first current to generate a third current; a ring oscillator that is configured to generate an oscillating signal having a frequency corresponding to the third current; and a buffer that is configured to convert a swing width of the oscillating signal into a full swing width.

In another aspect, the invention is directed to a method of generating an oscillating signal. The method includes: generating a first current having a first negative temperature coefficient based on a reference current; generating a second current, a current level of the second current varying in response to a first voltage level of a control voltage, and the second current having a second negative temperature coefficient; generating a third current corresponding to a difference between the first and second currents; and generating the oscillating signal having a frequency corresponding to the third current.

In one embodiment, generating a second current includes: converting a first voltage level of the control voltage into a second voltage level to generate a first voltage having the second voltage level; converting the second voltage level of the first voltage into a third voltage level to generate a second voltage having the third voltage level; and generating the second current corresponding to the second voltage.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS

Figure 1:
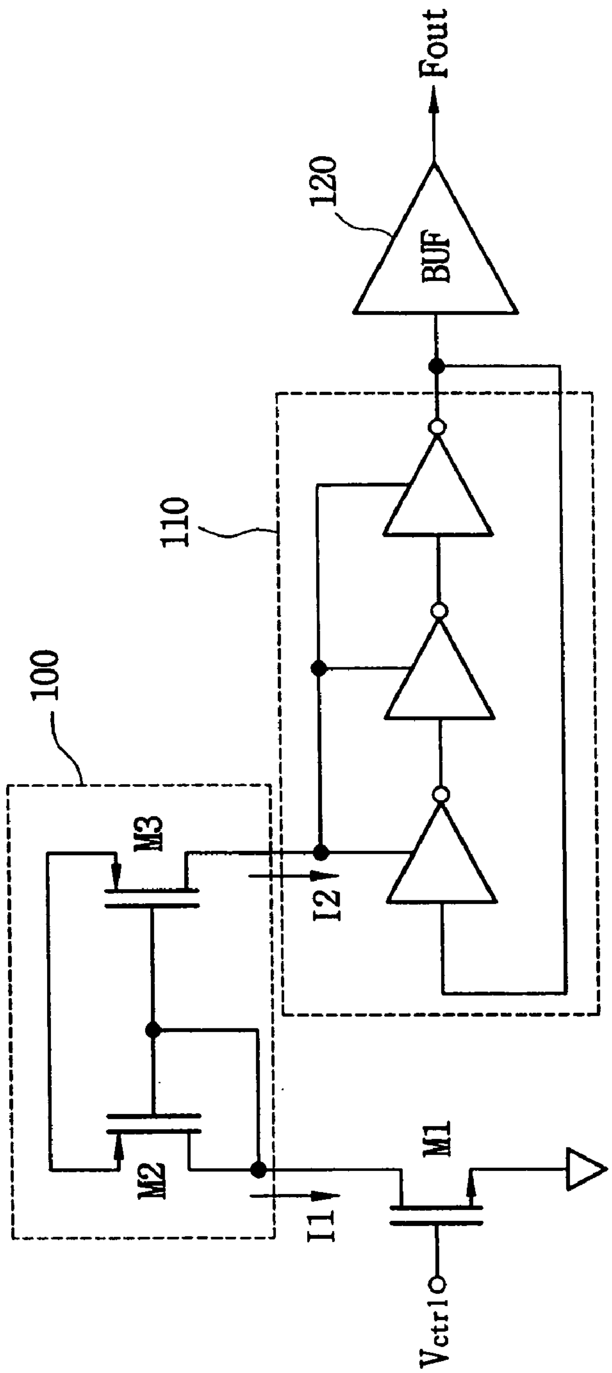
FIG. 1 is a circuit diagram showing a conventional voltage controlled oscillator.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It should also be noted that in some alternate implementations, the functions/acts noted in the steps may occur out of the order noted in the flowcharts. For example, two steps shown in succession may in fact be executed substantially concurrently or the steps may sometimes be executed in the reverse order, depending upon the functionality/acts involved.

Figure 3:
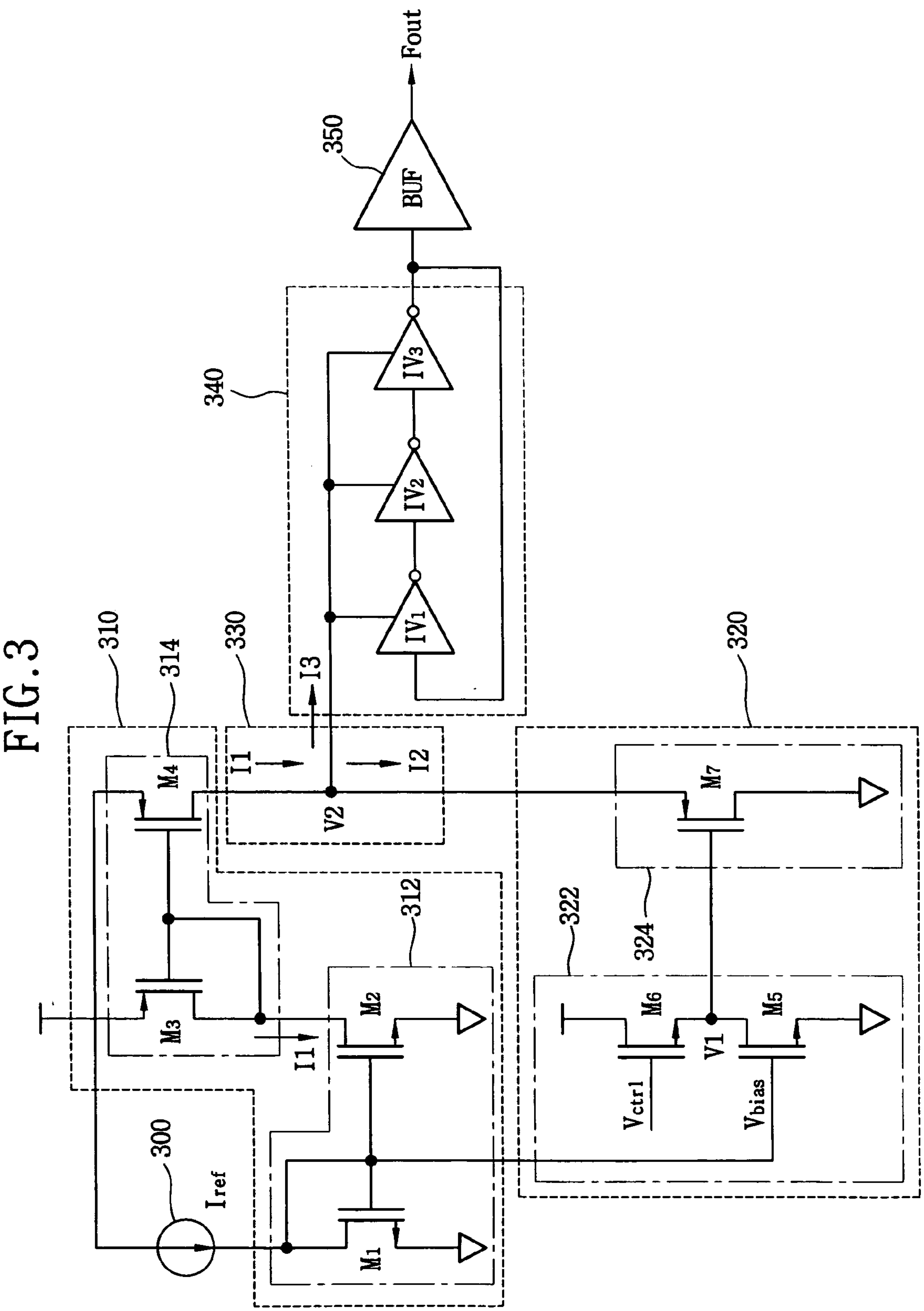
FIG. 3 is a circuit diagram showing a voltage controlled oscillator according to one exemplary embodiment of the present invention.

FIG. 3 is a circuit diagram showing a voltage controlled oscillator according to one exemplary embodiment of the present invention.

As shown in FIG. 3, the voltage controlled oscillator (VCO) includes a reference current source 300, a current mirror circuit 310, a voltage level shifter 320, a current subtractor 330, a ring oscillator 340 and a buffer 350.

The reference current source 300 generates a reference current Iref. The current mirror circuit 310 generates a first current I1. The first current is substantially the same current as the reference current Iref, and has a first negative temperature coefficient. The voltage level shifter 320 converts a first voltage level of the control voltage Vctrl into a second voltage level to generate a first voltage V1 having the second voltage level, and generates a second current I2. A current level of the second current I2 corresponds to the first voltage V1. The second current I2 has a second negative temperature coefficient. The current subtractor 330 subtracts the second current I2 from the first current I1, and generates a third current I3 corresponding to the difference between the first and second currents. Thus, the third current I3 is independent of temperature variation. The ring oscillator 340 generates a first oscillating signal having a frequency corresponding to the difference between the first and second currents. The buffer 350 converts a swing width of the first oscillating signal into a full swing width.

The current mirror circuit 310 includes a voltage generator 312 and a current mirror 314. The voltage generator 312 receives the reference current Iref, and generates a bias voltage Vbias based on the reference current Iref. The current mirror 314 generates the first current I1 substantially the same as the reference current Iref input from the voltage generator 312.

The voltage generator includes first and second transistors M1 and M2. A drain electrode of the first transistor M1 receives the reference current Iref from the reference current source 300. The drain electrode of the first transistor M1 is connected to a gate electrode of the first transistor M1. A gate electrode of the second transistor M2 is connected to the gate electrode of the first transistor M1. The current mirror 314 includes third and fourth transistors M3 and M4. For example, the first and second transistors M1 and M2 are NMOS transistors, and the third and fourth transistors M3 and M4 are PMOS transistors.

The voltage level shifter 320 includes first and second level shifters 322 and 324. The first level shifter 322 converts the first voltage level of the control voltage Vctrl into the second voltage level to generate the first voltage V1 having the second voltage level. The second level shifter 324 converts the second voltage level of the first voltage V1 into a third voltage level to generate a second voltage V2 having the third voltage level.

The first level shifter 322 includes fifth and sixth transistors M5 and M6. A gate electrode of the fifth transistor M5 receives a bias voltage Vbias, and a gate electrode of the sixth transistor M6 receives the control voltage Vcr1.

The second level shifter 324 includes a seventh transistor M7. A gate electrode of the seventh transistor M7 is connected to a source electrode of the sixth transistor M6. For example, the fifth and sixth transistors M5 and M6 are NMOS transistors, and the seventh transistor M7 is PMOS transistor.

The ring oscillator includes first, second and third inverters INV1, INV2 and INV3. The third current I3 output from the current subtractor 330 is applied to the first, second and third inverters INV1, INV2 and INV3. For example, the ring oscillator includes an odd number of inverters such as 5 or 7 inverters, etc.

Hereinafter, the operation of the VCO is described.

The voltage generator 312 of the current mirror circuit 300 generates the bias voltage Vbias based on the reference current Iref provided from the reference current source 300. The voltage generator 312 outputs the bias voltage Vbias to the gate electrode of the fifth transistor M5 of the first level shifter 322.

In addition, the current mirror 314 generates the first current I1 that is a mirror current of the reference current Iref provided from the voltage generator 312, and outputs the first current I1 to the current subtractor 330. The first current I1 has a negative temperature coefficient.

The first level shifter 322 shifts the first voltage level of the control voltage Vctrl into the second voltage level of the first voltage V1. The fifth transistor M5 of the first level shifter 322 is turned on by the bias voltage Vbias, and the sixth transistor M6 shifts the first voltage level of the control voltage Vctrl into the second voltage level to generate the first voltage V1 having the second voltage level.

The first voltage V1 is shown in expression 1.

$$V1=V_{ctrl}-(V_{th6}+\Delta V_6) \quad \text{<Expression 1>}$$

, wherein the $V_{th6}$ represents a threshold voltage of the sixth transistor M6, and $\Delta V_6$ represents a saturation voltage between the drain electrode and the source electrode of the sixth transistor M6.

The seventh transistor M7 of the second level shifter 324 receives the first voltage V1 generated by the sixth transistor M6 via the gate electrode of the seventh transistor M7, and the seventh transistor M7 shifts the second voltage level of the first voltage V1 into the third voltage level to generate the second voltage V2 having the third voltage level.

The second voltage V2 is shown in expression 2.

$$V2=V_1+(V_{th7}+\Delta V_7) \quad \text{<Expression 2>}$$

, wherein the $V_{th7}$ represents a threshold voltage of the seventh transistor M7, and $\Delta V_7$ represents a saturation voltage between the drain electrode and the source electrode of the seventh transistor M7.

The third voltage V3 is expressed using the control voltage Vctrl in expression 3.

$$V2=V_{ctrl}+(V_{th7}-V_{th6})+(\Delta V_7-\Delta V_6) \quad \text{<Expression 3>}$$

Expression 4 shows the voltage variation with respect to the temperature by applying partial difference to the expression 3.

$$\frac{\partial V2}{\partial T}=\frac{\partial V_{ctrl}}{\partial T}+\frac{\partial(V_{th7}-V_{th6})}{\partial T}+\frac{\partial(\Delta V_7-\Delta V_6)}{\partial T} \quad \text{⟨Expression 4⟩}$$

Since the control voltage Vctrl is independent of the temperature, $$\frac{\partial V_{ctrl}}{\partial T}$$

is zero.

$$\frac{\partial(V_{th7}-V_{th6})}{\partial T}$$

has very small value and is almost zero.

$$\frac{\partial(\Delta V_7-\Delta V_6)}{\partial T}$$

is proportional to the current mobility difference between the seventh and sixth transistors M7 and M6 with respect to the temperature change, since $$\frac{\partial \Delta V_7}{\partial T} \text{ and } \frac{\partial \Delta V_6}{\partial T}$$

has negative value, respectively, $$\frac{\partial(\Delta V_7-\Delta V_6)}{\partial T}$$

is almost zero. As a result, $$\frac{\partial V2}{\partial T}$$

s almost zero. Therefore, the second voltage V2 has substantially a constant independent of temperature variation and is proportional to the control voltage Vctrl.

The current subtractor 330 subtracts the first current I1 generated from the current mirror 314 from the second current I2 applied to the source electrode of the seventh transistor M7, generates the third current I3, and outputs the third current I3 to the ring oscillator 340.

The third current I3 is shown in expression 5.

$$I3=I1-I2=I1-\beta(V1-V2)^2 \quad \text{<Expression>5}$$

The third current I3 is rewritten using expression 2 in the expression 6.

$$I3=I1-\beta(V_{th7}+\Delta V_7)^2 \quad \text{<Expression 6>}$$

, wherein β represents a proportional constant.

Expression 7 shows the current variation with respect to the temperature by applying partial difference to the expression 6.

$$\frac{\partial I3}{\partial T}=\frac{\partial I1}{\partial T}-\frac{\partial\beta(V_{th7}+\Delta V_7)^2}{\partial T}+\frac{\partial 2\beta(V_{th7}+\Delta V_7)}{\partial T} \quad \text{(Expression 7)}$$

Since $$\frac{\partial(V_{th7}+\Delta V_7)}{\partial T}$$

is almost zero, $$\frac{\partial I3}{\partial T}$$

is determined by $$\frac{\partial I1}{\partial T} \text{ and } \frac{\partial\beta}{\partial T}.$$

Since $$\frac{\partial\beta}{\partial T}$$

has a negative value depending upon physical property, $$\frac{\partial I3}{\partial T}$$

has almost zero when $$\frac{\partial I1}{\partial T}$$

has a negative value.

Since the first current I1 is the mirror current of the reference current Iref, $$\frac{\partial I1}{\partial T}$$

has a negative value when the Iref variation with respect to the temperature $$\left(\frac{\partial I_{ref}}{\partial T}\right)$$

has a negative value. Thus, the I3 variation with respect to the temperature $$\left(\frac{\partial I3}{\partial T}\right)$$

is almost zero. Therefore, the ring oscillator 340 generates the oscillating signal having a stable frequency corresponding to the third current I3 that is independent of the temperature.

The buffer converts the swing width of the oscillating signal generated from the ring oscillator into a full swing width to output an oscillating signal Fout.

As described above, the first current I1 output from the current mirror circuit 310 has a first negative temperature coefficient, and the second current I2 output from the voltage level shifter 320 has a second negative temperature coefficient. Thus, the third current generated from the current subtractor 330 by subtracting the second current I2 from the first current I1 is independent of temperature variation. That is, the third current I3 has substantially constant value independent of temperature variation and is provided to the ring oscillator 340.

Figure 4:
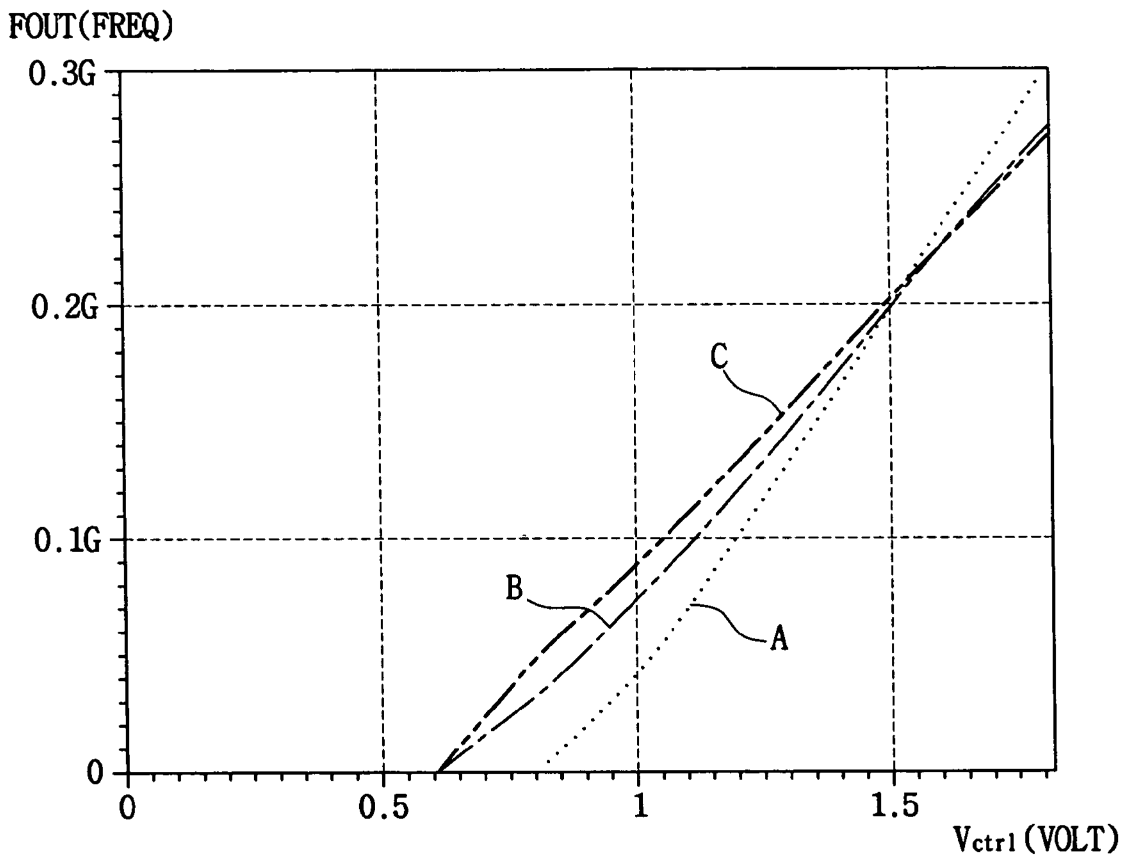
FIG. 4 is a graph showing frequency variations of the voltage controlled oscillator of the present invention according to temperature variation.

FIG. 4 is a graph showing frequency variations of the voltage controlled oscillator of the present invention according to temperature variation when the control voltage Vctrl varies from 0 volt to about 1.8 volts. Curve 'A' of FIG. 4 shows frequency variation when the temperature is about −55° C., curve 'B' of FIG. 4 shows frequency variation when the temperature is about 55° C., and curve 'C' of FIG. 4 shows frequency variation when the temperature is about 125° C.

Figure 2:
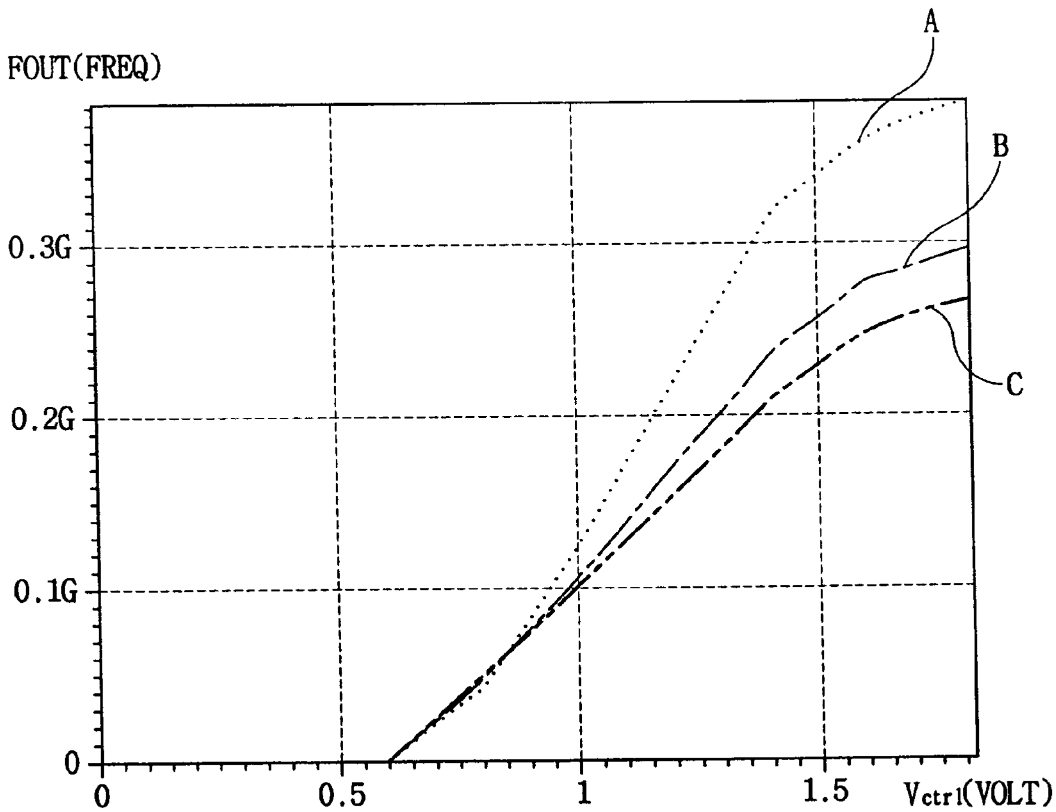
FIG. 2 is a graph showing frequency variations of the voltage controlled oscillator of FIG. 1 according to temperature variation.

Referring to FIG. 4, the variation ratio of the gain (slope of the curve in FIG. 4) with respect to the temperature is reduced by about two times compared with that of the conventional VCO of FIG. 2.

Figure 5:
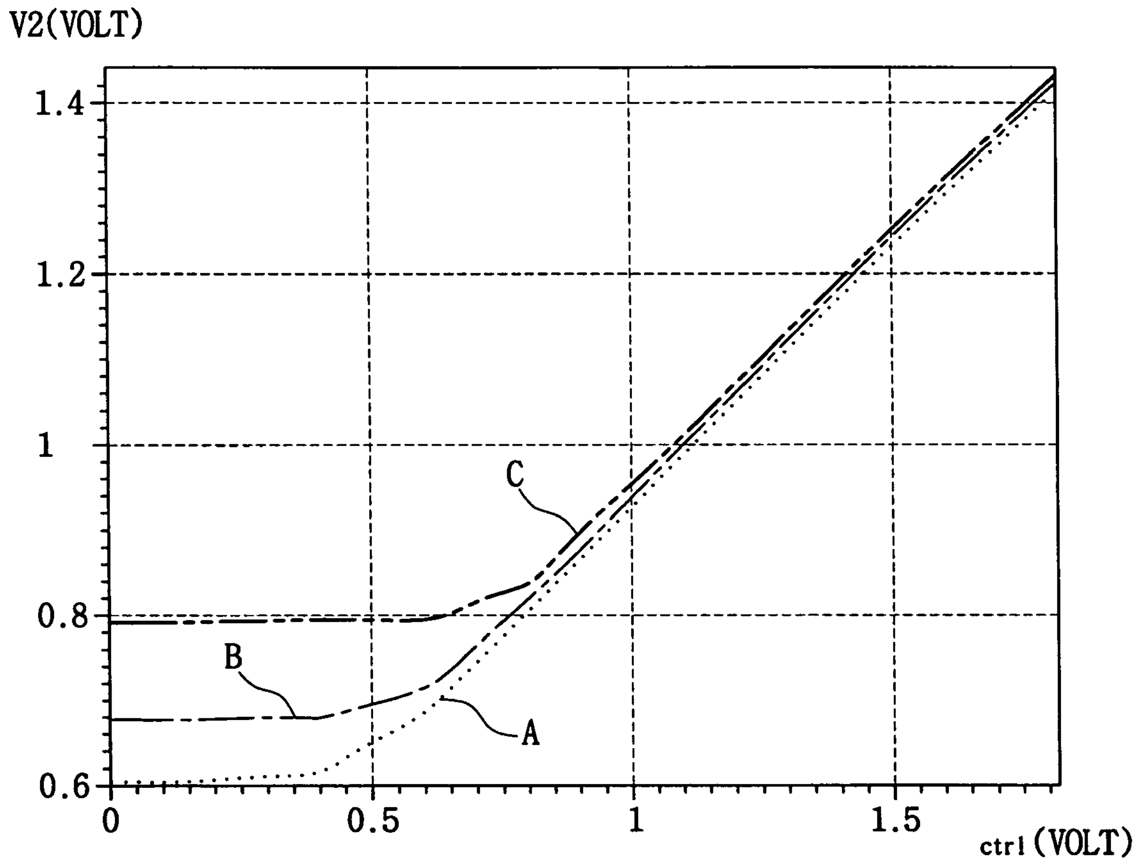
FIG. 5 is a graph showing the variation of the second voltage of the voltage controlled oscillator of the present invention according to temperature variation.

FIG. 5 is a graph showing the variation of the second voltage of the voltage controlled oscillator of the present invention according to temperature variation when the control voltage Vctrl varies from 0 volt to about 1.8 volts. Curve 'A' of FIG. 5 shows variation of the second voltage V2 when the temperature is about −55° C., curve 'B' of FIG. 5 shows variation of the second voltage V2 when the temperature is about 55° C., and curve 'C' of FIG. 5 shows variation of the second voltage V2 when the temperature is about 125° C.

As shown in FIG. 5, the variation ratio (slope of the curve in FIG. 5) of the second voltage V2 has substantially constant value, and the second voltage V2 is independent of temperature variation.

Figure 6:
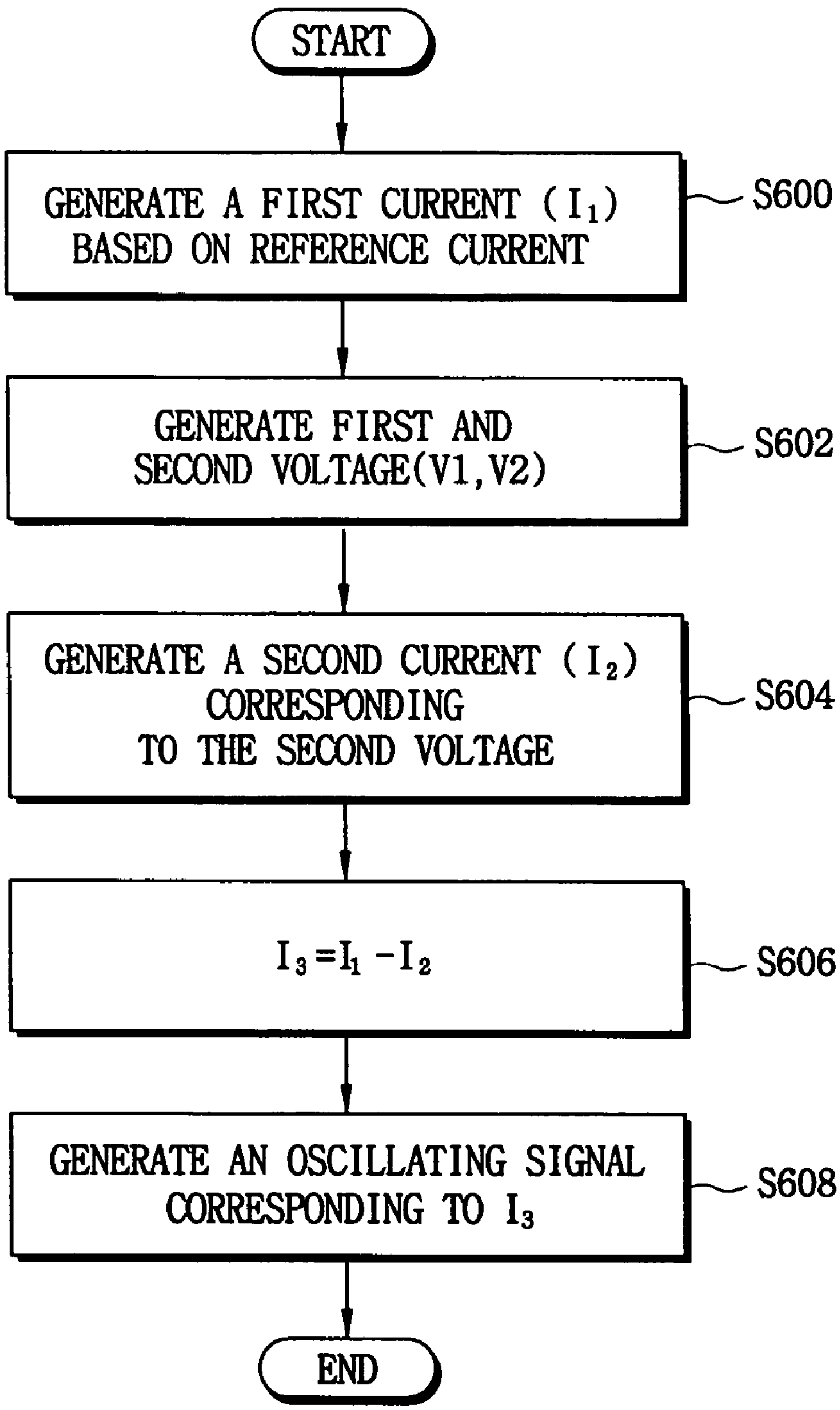
FIG. 6 is a flow chart showing a method of generating an oscillating signal according to one exemplary embodiment of the present invention.

FIG. 6 is a flow chart showing a method of generating an oscillating signal according to one exemplary embodiment of the present invention.

Referring to FIG. 6, the current mirror circuit 310 generates a first current I1 that is substantially the same as a reference current Iref input from the reference current source 300 (step S600). The first current I1 has a first negative temperature coefficient.

The first level shifter 322 of the voltage level shifter 320 shifts a first voltage level of the control voltage Vctrl into a second voltage level to generate a first voltage V1 having the second voltage level, and the second level shifter 324 of the voltage level shifter 320 shifts the second voltage level of the first voltage V1 into a third voltage level to generate a second voltage V2 having the third voltage level (step S602). The first and second voltage V1 and V2 are independent of temperature variation.

The second level shifter 324 generates a second current I2 corresponding to the second voltage V2 (step S604). The second current I2 has a second negative temperature coefficient.

The current subtractor 330 subtracts the second current I2 from the first current I1 to generate a third current I3 (step S606). Since the first and second currents I1 and I2 both have negative temperature coefficients, the third current I3, generated by subtracting the second current I2 from the first current I1, is independent of temperature variation.

Then, the ring oscillator 340 generates an oscillating signal having a frequency corresponding to the third current I3 (step S608). The oscillating signal has substantially constant swing width. The buffer 350 changes the swing width of the oscillating signal into a full swing width.

According to above exemplary embodiments of the present invention, the VCO generates the oscillating signal based on the third current that is independent of temperature variation, and thus the oscillating signal has a stable frequency that is independent of temperature variation. Therefore, the stability of the system using the VCO according to above exemplary embodiments of the present invention may be enhanced.

In addition, when the VCO according to above exemplary embodiments of the present invention is used in a semiconductor chip of a high speed digital system that generates a lot of heat, the VCO may operates stably even though a lot of heat is generated.

While the exemplary embodiments of the present invention and their advantages have been described in detail, it should be understood that various changes, substitutions and alterations may be made herein without departing from the scope of the invention.

What is claimed is:

1. A voltage controlled oscillator comprising:

a current source that is configured to generate a first current having a first negative temperature coefficient;

a current sink that is configured to generate a second current, a current level of the second current varying in response to a first voltage level of a control voltage, the second current having a second negative temperature coefficient; and a frequency generator that is configured to generate an oscillating signal having a frequency corresponding to a difference between the first and second currents.

2. The voltage controlled oscillator of claim 1, wherein the current source includes:

a reference current source that is configured to generate a reference current;

a voltage generator that is configured to receive the reference current to generate a bias voltage based on the reference current; and a current mirror circuit that is configured to generate the first current, the first current being substantially a same current as the reference current.

3. The voltage controlled oscillator of claim 2, wherein:

the voltage generator includes:

a first transistor, a second current electrode of the first transistor receiving the reference current, the second current electrode of the first transistor being connected to a control electrode of the first transistor, and a second transistor, a control electrode of the second transistor being connected to the control electrode of the first transistor; and the current mirror circuit includes:

a third transistor, a second current electrode of the third transistor being connected to the second current electrode of the second transistor, the second current electrode of the third transistor being connected to a control electrode of the third transistor, and a fourth transistor, a control electrode of the fourth transistor being connected to the control electrode of the third transistor.

4. The voltage controlled oscillator of claim 1, wherein the current sink includes:

a voltage level shifter that is configured to convert the first voltage level of the control voltage into a second voltage level to generate a first voltage having the second voltage level, and is configured to generate the second current corresponding to the first voltage; and a current subtractor that is configured to subtract the second current from the first current.

5. The voltage controlled oscillator of claim 4, wherein the voltage level shifter includes:

a first level shifter that is configured to convert the first voltage level of the control voltage into the second voltage level to generate the first voltage having the second voltage level; and a second level shifter that is configured to convert the second voltage level of the first voltage into a third voltage level to generate a second voltage having the third voltage level.

6. The voltage controlled oscillator of claim 5, wherein the first level shifter includes:

a first transistor, a control electrode of the first transistor receiving a bias voltage based on a reference current;

a second transistor, a control electrode of the second transistor receiving the control voltage, a first current electrode of the second transistor being connected to a second current electrode of the first transistor, and wherein the second level shifter includes a third transistor, a control electrode of the third transistor receiving the first voltage from the first level shifter, a first current electrode of the third transistor being connected to the current subtractor.

7. The voltage controlled oscillator of claim 1, wherein the frequency generator includes:

a ring oscillator that is configured to generate a first oscillating signal having the frequency corresponding to the difference between the first and second currents; and a buffer that is configured to convert a swing width of the first oscillating signal into a full swing width to generate the oscillating signal.

8. A voltage controlled oscillator comprising:

a voltage generator that is configured to generate a bias voltage based on a reference current;

a current mirror circuit that is configured to generate a first current, the first current being substantially the same current as the reference current and having a first negative temperature coefficient;

a first level shifter that is configured to convert a first voltage level of the control voltage into a second voltage level in response to the bias voltage to generate a first voltage having the second voltage level;

a second level shifter that is configured to convert the second voltage level of the first voltage into a third voltage level to generate a second voltage having the third voltage level, and configured to generate a second current corresponding to the second voltage and having a second negative temperature coefficient;

a current subtractor that is configured to subtract the second current from the first current to generate a third current;

a ring oscillator that is configured to generate an oscillating signal having a frequency corresponding to the third current; and a buffer that is configured to convert a swing width of the oscillating signal into a full swing width.

9. A method of generating an oscillating signal, the method comprising:

generating a first current having a first negative temperature coefficient based on a reference current;

generating a second current, a current level of the second current varying in response to a first voltage level of a control voltage, and the second current having a second negative temperature coefficient;

generating a third current corresponding to a difference between the first and second currents; and generating the oscillating signal having a frequency corresponding to the third current.

10. The method of claim 9, wherein said generating a second current includes:

converting a first voltage level of the control voltage into a second voltage level to generate a first voltage having the second voltage level;

converting the second voltage level of the first voltage into a third voltage level to generate a second voltage having the third voltage level; and generating the second current corresponding to the second voltage.

* * * * *